United States Patent [19]

Schneider

[11] 4,024,430
[45] May 17, 1977

[54] MODULATOR AND CLAMPER FOR VARIABLE IMPEDANCE LOAD

[75] Inventor: Sol Schneider, Little Silver, N.J.

[73] Assignee: The United States of America as represented by the Secretary of the Army, Washington, D.C.

[22] Filed: Sept. 29, 1975

[21] Appl. No.: 617,881

[52] U.S. Cl. .............................. 315/289; 307/237; 315/207; 315/244; 315/310; 328/171
[51] Int. Cl.² ........................................ H03K 5/08
[58] Field of Search .......... 315/291, 293, 306, 310, 315/311, 324, 244, 289, 200 R, 207; 328/64, 67, 171; 307/237, 268; 325/13

[56] References Cited

UNITED STATES PATENTS

| 2,947,884 | 8/1960 | Horodyski | 328/67 |
|---|---|---|---|
| 3,051,906 | 8/1962 | Haynes | 328/67 |
| 3,185,928 | 5/1965 | Coyle | 328/67 |
| 3,337,755 | 8/1967 | Grabowski et al. | 328/67 |
| 3,394,284 | 7/1968 | Hurkamp et al. | 328/67 |

FOREIGN PATENTS OR APPLICATIONS

| 255,987 | 10/1962 | Australia | 328/67 |

OTHER PUBLICATIONS

IEEE International Electron Devices Meeting, 12, 1974, pp. 173–176 High Voltage Modulator for E-Beam Guns and Megawatt Average Power Switches for Sustainer Discharges.
The Dept. of Defense Laser Conference, 10, 1974, pp. 279–281 and p. 300 Repetitively Pulsed, Cold Cathode E-Beam, Self-Switching Laser Electronic Design 17, Aug. 16, 1969, pp. 190–193.

Primary Examiner—Eugene R. La Roche
Attorney, Agent, or Firm—Nathan Edelberg; Sheldon Kanars; Edward Goldberg

[57] ABSTRACT

A transformerless Blumlein type circuit is combined with a novel clamper circuit for driving a cold cathode electron beam gun for a $CO_2$ laser where the E-beam gun has resistance essentially infinite at the leading end of a driving pulse and has several ohms resistance at the end of the driving pulse. At the leading end of a driving pulse the voltage output of the Blumlein circuit is twice the rated load voltage since the load as infinite impedance. The clamper circuit limits the pulse voltage across the load to its rated voltage and the excess power from the Blumlein circuit over that required by the load is dissipated in the clamper circuit. The clamper circuit as variable impedance that is approximately the inverse of the load impedance during a driving pulse so that the Blumlein circuit looks into an approximately constant impedance equal to its impedance.

10 Claims, 6 Drawing Figures

W/O CLAMPER

WITH CLAMPER

MODULATOR AND CLAMPER FOR VARIABLE IMPEDANCE LOAD

This invention described herein may be manufactured and used by or for the Government for governmental purposes without payment of any royalties thereon or therefor.

BACKGROUND OF THE INVENTION

A cold cathode electron beam gun also called an E-beam gun can be used to improve the operation of a $CO_2$ laser. The $CO_2$ laser includes a tubular envelope containing the gas at one atmosphere or more. There are parallel spaced electrodes inside the envelope that are oriented longitudinally. A fast discharge between electrodes is required for proper functioning of the $CO_2$ laser and for longer operating life of the laser. The driving pulse needs to be as short as possible to minimize the likelihood that any hot spot between electrodes will avalanche to a high current hard arc. Pre-ionization of the gas between electrodes contributes to a more uniform discharge. One method of preionization is to pulse an E-beam gun directed transverse to the main electrodes and between the full length of the electrodes. A well defined pulse shape, i.e., approximately rectangular with a nearly flat top, is required. The gun resistance varies during the pulse length from infinity at the start of a driving pulse to several ohms at the end of the driving pulse. Thus driven, the gun delivers a ramp current rising from zero. It may be required to operate single-shot or at a regular repetition rate. Voltage across the E-beam gun must be unidirectional to avoid arcing.

Volume 5 of the Radiation Laboratory series published by McGraw-Hill, and entitled "Pulse Generators", provides background information on line-type pulsers, referred to hereafter as line-type modulators or modulators that can be used to drive an E-beam gun. Energy is stored electrostatically or magnetically and all of the stored energy is discharged into the load during each pulse under the control of a switch that is closed for a length of time corresponding to pulse duration and is open for at least the interpulse time required to store the same amount of energy for the next pulse. The load impedance and the network impedance are equal for optimum power transfer. A well-defined pulse is delivered by the pulse forming network. Load voltage is equal to one-half the voltage of the energy storing network immediately prior to a pulse. However, if a load of variable impedance such as an E-beam gun for driving a laser or a crossed-field amplifier for a radar, is connected across a line-modulator pulse forming network of constant impedance, the impedance mismatch causes damaging voltage reflections as well as varying voltage across the load. High voltage operation can exacerbate the problem. One illustration is a pulse source that can provide a pulse of about two microseconds, that is substantially flat and on the order of 250,000 volts, and that supplies ramp current during the pulse rising from zero to about 20,000 amperes and at a repetition rate on the order of 50 hertz, for operating an E-beam gun for a $CO_2$ laser.

SUMMARY OF THE INVENTION

A variable impedance pulsed load exemplified by an E-beam gun is driven by a line modulator where impedance seen from the load terminals is equal to the minimum impedance of the load. In order that the voltage across the load not be below a predetermined minimum during a pulse, despite impedance variation and mismatch, the pulse delivered by the line modulator is of substantially higher voltage than required by the load. A clamper circuit is connected in parallel with the load to limit the voltage across the load to that required by the load. The clamper impedance is approximately the inverse of that of the load so that together they present a substantially constant impedance to the pulse source and which is approximately equal to the impedance of the pulse source. The clamper includes a capacitor shunted by a bleeder resistor and in series with a charging resistor and a diode to prevent the clamper capacitor from discharging through the load. The resistance of the charging resistor is equal to the impedance of the pulse source. The impedance characteristic of the capacitor together with the charging resistor is approximately the inverse of the impedance of the E-beam gun during a pulse. The line modulator is a transformerless Blumlein circuit charged to voltage V and providing voltage 2V to the load at the leading end of a pulse. The clamper limits load voltage to V. The clamper is useful with other modulators and is useful with other variable impedance pulse loads. The clamper capacitor is a single capacitor or a network of capacitors for providing an impedance characteristic that is substantially the inverse of that of the load and for precluding any voltage rail of reverse or positive polarity at the end of a pulse because of a negative or positive mismatch with the network.

DESCRIPTION OF A PREFERRED EMBODIMENT

Figure 1:
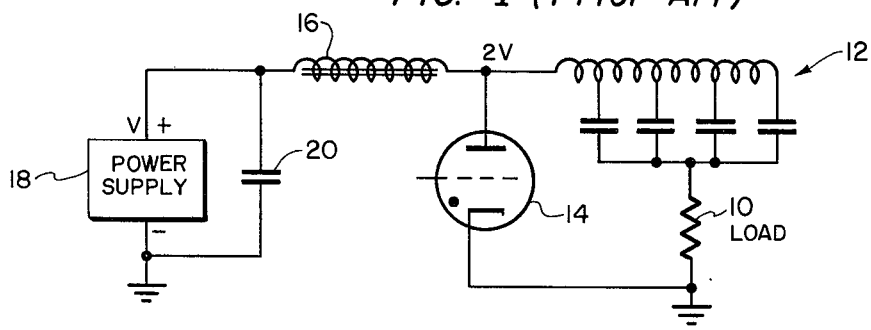
FIG. 1 is a combination block and circuit diagram illustrating the state of the prior art.

A conventional modulator arrangement that generates approximately rectangular pulses is shown in FIG. 1 for driving a load 10. Load 10 is connected between ground and a lumped impedance modulator network 12; a thyratron 14 is connected in parallel with the series-connected load 10 and network 12. A charging choke 16 connects the positive terminal of a direct current power supply 18 of terminal voltage V to the junction of modulator network 12 and thyratron 14. The negative terminal of power supply 18 is connected to ground. A filter represented by a capacitor 20 is connected across the power supply 18. When network 12 is fully discharged, the thyratron is non conductive, and modulator network 12 is charged to about voltage 2V due to the presence of the charging choke. When the thyratron 14 conducts the voltage 2V across modulator network 12 redistributes across the network and the load. If the impedances of load 10 and network 12 are equal, and the load impedance is constant, voltage V appears across the load during each pulse. If, instead of charging choke 16, a resistor or low Q inductor is used, then the network charges to V rather than 2V and during discharge of the network, V/2 appears across the load, again assuming equal impedances for load and network.

There are pulse loads that require constant pulse voltage but have extremely variable impedance during an applied pulse. Such loads cannot be driven by prior art modulator circuits as in FIG. 1. Under high voltage operating conditions, gross impedance mismatch between the modulator and load during a pulse may damage the load and also causes high voltage reflections that overstress or destroy passive circuit components. Also, thyratron 14 would see either a large inverse voltage that might cause it to arc or a large forward voltage at the end of the pulse such that it would discharge again thus delaying modulator recharge. Even if the load impedance varies moderately, the resultant impedance mismatch during the pulse precludes constant voltage across the load and the load does not function properly. The relationship of modulator network impedance and instantaneous load impedance determines the instantaneous percent of available voltage that is across the load. For the load voltage of an unmatched load to be essentially constant throughout each driving pulse, load voltage exceeds that required and the excess voltage must be removed. There has been no satisfactory circuit arrangement for a high voltage high power E-beam gun and other loads having similar operating characteristics. The impedance of an E-beam gun is substantially infinite at the beginning of a pulse and drops to several ohms by the end of a pulse and approximates the inverse of the impedance characteristic of a resistor capacitor circuit when the latter is charged. If a conventional clamper circuit is used with the E-beam gun, an additional DC power supply is required. Also, there is needed a capacitor bank much larger than required in this invention to provide some degree of voltage regulation. This invention concerns a novel clamper circuit that eliminates such additional power supply and reduces the capacitor bank by an order of magnitude while providing much better voltage regulation.

A paper coauthored by this inventor was delivered at the Department of Defense Laser Conference, Oct. 1974, at San Diego, Calif. and appears in the Proceedings. Also, a paper coauthored by this inventor was delivered at the IEEE International Electron Devices Conference, Dec. 1974, Washington, D.C. and appears in the Proceedings.

Figure 2:
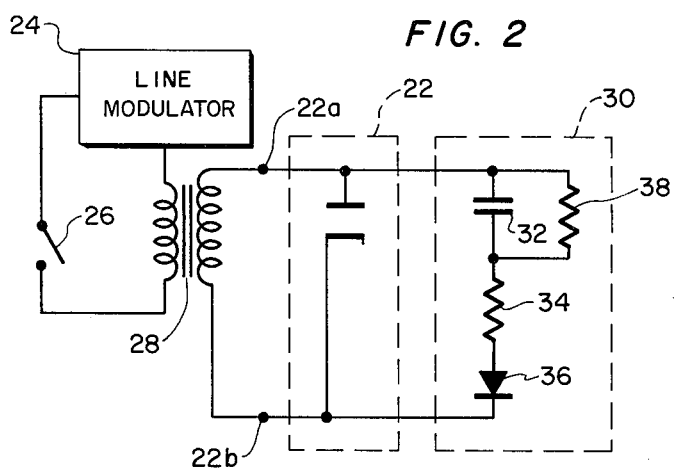
FIG. 2 is a combination block and circuit diagram illustrating the broader aspects of this invention.

In its broader aspects the invention is illustrated in FIG. 2. An E-beam gun 22 symbolized by a cathode and anode is driven by a pulse source that includes a line modulator 24, a switch 26 and a pulse transformer 28 for stepping up or stepping down the pulse voltage. A clamper circuit 30 in accordance with this invention is connected in parallel with E-beam gun 22. The clamper includes a capacitor 32 in series with a charging resistor 34 and a diode 36; a bleeder resistor 38 is connected across the capacitor 32. The resistance 34 is equal to the minimum resistance of the E-beam gun 22 and is also equal to the impedance of the pulse source as seen from the load terminals 22a, 22b. The combination of the clamper capacitor and the charging resistor vis-a-vis the E-beam gun during a pulse have approximately inverse impedance characteristics so that the pulse source looks into a substantially constant impedance during the pulse. The bleeder resistance 38 is selected so that the capacitor is discharged before a succeeding pulse. Preferably, the time constant of the bleeder resistor in combination with the clamper capacitor is less than one-fifth the interpulse interval; otherwise the size of resistance 38 is not critical. Operation may be single short or regular or varying pulse repetition rates.

Pulse transformer design problems make it preferable to use a transformerless modulator that provides a well defined pulse shape. "Pulse Generators" cited previously suggests discharge networks that can provide load voltage greater than the network voltages; the Darlington circuit is an n-network circuit for such purpose and the Blumlein circuit is the two net-work example of the Darlington circuit. A normally open switch is across the front end of the two-network Blumlein circuit. A regulated filtered power supply charges both networks of the Blumlein circuit to the same voltage. When the switch in the Blumlein circuit is closed, the effect is reversal of the voltage of that network terminated by the switch so that the voltages of the two networks are in additive series across the load terminals. Voltage reversal and resultant voltage doubling at the load terminals occurs a fraction of pulse length following switching. Ideally the impedances of the two networks of the Blumlein circuit are equal and impedance of the Blumlein circuit and the impedance of the load are equal. When the switch is closed, voltage redistributes between the Blumlein circuit and the load in proportion to the respective impedances.

Figure 3:
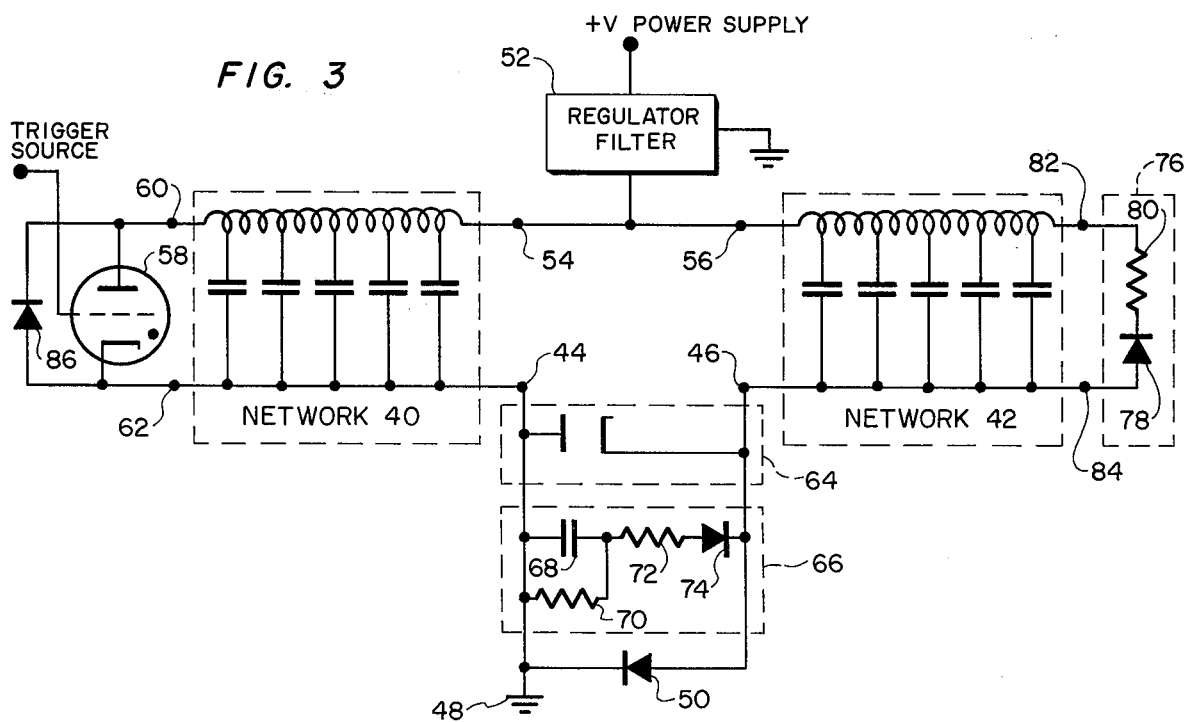
FIG. 3 is a combination block and circuit diagram of a preferred embodiment of this invention.

A preferred embodiment shown in FIG. 3 includes a Blumlein circuit that has two substantially identical energy-storing four terminal networks 40, 42 of cascaded LC sections. Terminal 44 is connected to ground connection 48. A charging diode 50 for network 42 connects terminal 46 of network 42 to the ground connection. A regulator and filter circuit 52 connects the positive terminal of a grounded DC power supply, not shown, to the terminals 54 and 56 of networks 40 and 42 respectively. A shorting switch shown as a thyratron 58 is connected across the front end terminals 60, 62 of network 40; the grid of the thyratron 58 is connected to a trigger pulse source. After the networks 40, 42 are fully charged by the power supply, the thyratron 58 is triggered to short circuit the front end of the Blumlein circuit; the effect is reversal of the voltage of network 40. The voltages of the networks 40, 42 are then in additive series across the load terminals 44, 46. There is a time delay between closing the switch 58 and the appearances of the positive summed voltages on terminal 44 relative to terminal 46 and the voltage reversal time may be equal to about one-half the time between the triggering of thyratron 58 and the appearance of the doubled voltage across terminals 44 and 46.

An E-beam gun 64, has its anode connected to terminal 44 and its cathode connected to terminal 46. The resistance of the E-beam gun 64 is essentially infinite when not activated but when rated voltage is applied, the resistance manifests a ramp-like decrease to its operating resistance of several ohms. The impedance of the Blumlein circuit between terminals 44, 46 and the operating resistance of the E-beam gun are equal. Charging diode 50 is in parallel with the load terminals 44 and 46 and serves a double function. Charging diode 50 provides a charging path for network 42 but is an open circuit relative to the load terminals 44, 46 during modulator discharge. Additionally, charging diode 50 acts as a clipper diode for the load shunting any inverse voltage that might appear across the load due to any mismatch between the load and the Blumlein circuit, thereby protecting the load against arcing damage.

Since the E-beam gun has a variable resistance that manifests a ramp-like decrease from essentially infinity at the beginning of a pulse to several ohms at the end of the pulse, the impedance mismatch at the beginning of the pulse causes the combined voltages of networks 40 and 42 to appear across the terminals of the E-beam gun and could cause the E-beam gun to arc. To remove the excess voltage from across the load, a clamper circuit 66 as in FIG. 3 is connected across the load terminals 44, 46 to limit the voltage across the E-beam gun. Clamper circuit 66 includes a capacitor 68 shunted by a bleeder resistor 70 and that is connected in series with a charging resistor 72 and a diode 74. The resistor 72 has resistance equal to the impedance of the Blumlein circuit as seen from the terminals 44 and 46 and to the minimum or operating resistance of the E-beam gun 64; when leading edge of a pulse appears across the terminals 44, 46 it looks into a load represented by resistor 72. The E-beam gun dissipates one-half of the charge stored in networks 40, 42 during a pulse. Of the remainder, one-half is dissipated by charging resistor 72 charging of clamper capacitor 68 to the rated voltage of the E-beam gun. Bleeder resistor 70 dissipates the remaining charge stored in the clamper capacitor.

The power supply is rated for about twice the average current through the load since the Blumlein circuit delivers about one-half its charge to the load and the other one-half to the clamper circuit. An end of the line clipper 76 including a diode 78 and resistor 80 is connected across terminals 82 and 84 of network 42. During charging of the networks from the power supply and normally during pulses, clipper 76 is out of the circuit. In the event of a short-circuit, i.e. zero load impedance across the load terminals during a pulse, the circuit behaves as a conventional line type modulator generating a pulse of doubled pulse length that appears inversely across terminals 82 and 84. The resistance 80 is designed to match the impedance of the then parallel networks 40, 42; during the short across the load terminals, the end-of-the-line clipper 76 acts as a load, dissipates the pulse energy and removes the inverse voltage, permitting the modulator to function normally on the next pulse, if the fault in the load clears. A clipper diode 86 is connected across thyratron switch 58 to bypass any inverse voltage that might arise.

Figure 4:
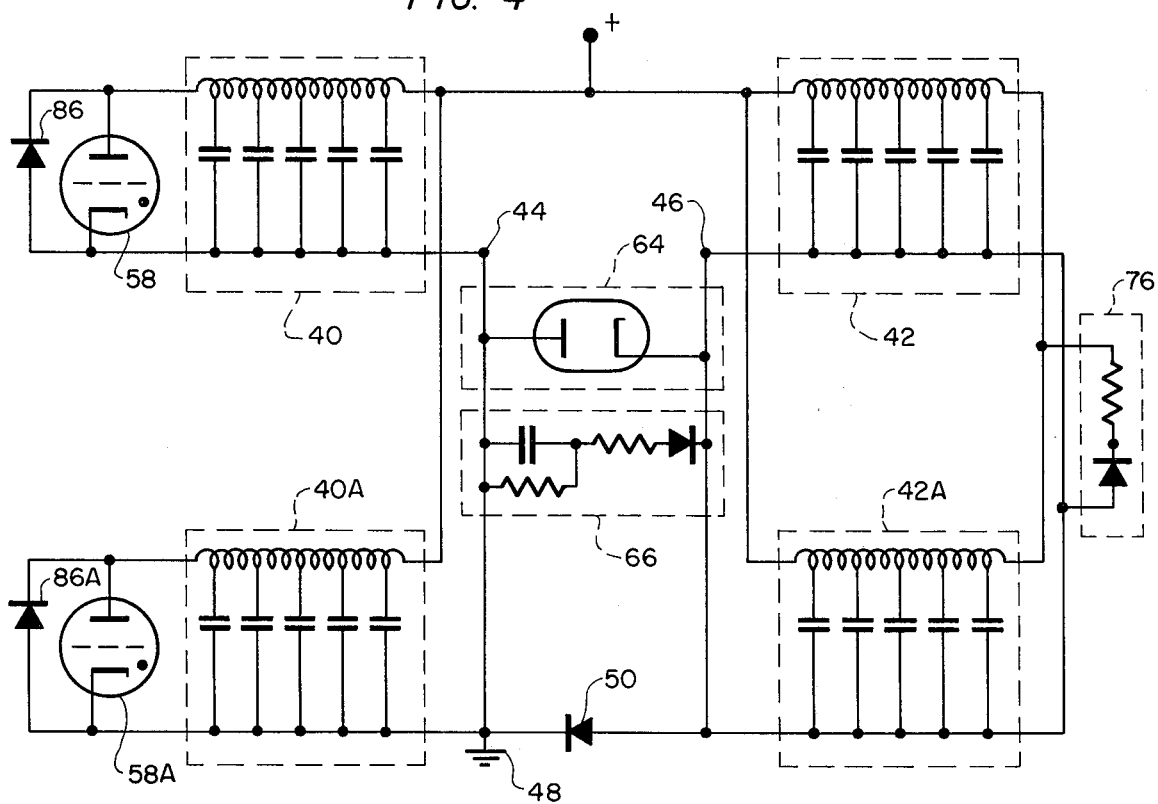
FIG. 4 is a modification of the circuit of FIG. 3 for higher current applications.

FIG. 4 is a modification of FIG. 3 for use when current is too high for a single thyratron 58. Two Blumlein circuits are connected in parallel so that the overall impedance as seen from the load terminals or from the end-of-the-line clipper is halved. The reference characters corresponding to identical components in FIG. 3 is the same; parallel connected circuit elements of the same characteristics are designated by the same reference characters followed by the letter A. Connection among the four networks of the circuit shown in FIG. 4 can be rearranged as a Darlington circuit to double the pulse length, halve the current, and double the voltage by connecting two networks in cascade on either side of the load terminals.

For very high power applications of the circuits shown in FIGS. 3 and 4, the resistors must be able to dissipate generated heat. A novel resistor combination advantageous for this invention includes a mixture of dilute copper sulfate and sulfuric acid, circulated in a fluid circuit which is, in part, a heat exchanger and, in part, tubular columns that carry electrodes near opposite ends of the columns.

Figure 5A:
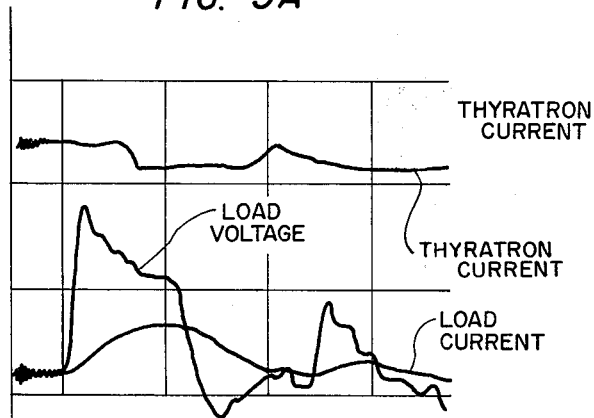
FIGS. 5A and 5B show operation of the circuit of FIG. 4 without and with the clamper, respectively.
Figure 5B:
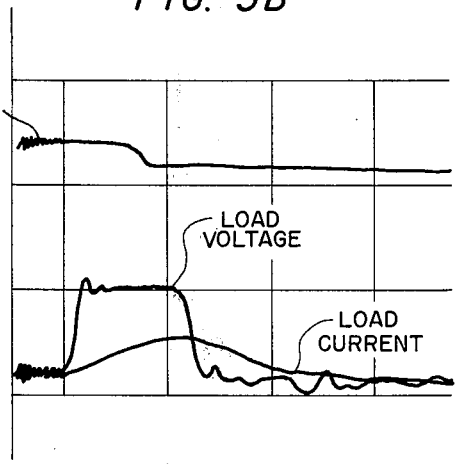

A combination Blumlein circuit and clamper circuit as shown in FIG. 4 was tested at 5000 volts. The impedance of each of the two parallel-connected Blumlein circuits tested was 45 ohms and generated 2 microsecond pulses. An inductor-resistor combination, not shown, was used to simulate an E-beam gun load; the inductor-resistor has an impedance characteristic similar to that of an E-beam gun. The clamper circuit consisted of a 0.02 microfarad capacitor in series with an 88 ohm resistor, and a 58,000 ohm bleeder resistor in parallel with the capacitor. FIG. 5A shows the results when the clamper is not connected and FIG. 5B shows the results with the clamper connected. FIG. 5A shows that the initial voltage across the load in the absence of the clamper is about twice the voltage to which the Blumlein circuit is charged; positive and negative voltage excursions appear across the load after the main pulse. Also there is an additional current pulse through the thyratron. With the clamper connected, FIG. 5B shows that the load voltage is nearly constant and there are no voltage excursions after the main pulse.

What is claimed is:

1. A circuit for driving a variable impedance pulsed load comprising means for delivering a driving pulse to the load; and clamper means including series connected capacitive means, resistive means, and unidirectional conduction means connected across the load and having an impedance that is substantially the inverse of the impedance of the load, the combined load and clamper means impedances providing an approximately constant impedance to the driving pulse means during a driving pulse, said clamper means including means for dissipating overflow power from said driving pulse.

2. A modulator circuit for a variable impedance load having an impedance that decreases to a predetermined low level upon application of a pulse of predetermined voltage across the load comprising:

a direct voltage power supply;

a Blumlein circuit including two networks of cascaded LC sections, the Blumlein circuit impedance being a predetermined low level impedance, said networks having corresponding first, second, third, and fourth terminals, the first terminals being connected in common for connection to the positive terminal of said power supply, said Blumlein circuit including a switch means connected across the second and third terminals at one end of one network whereby after the networks are charged and the second and third terminals of the one network are shorted by said switch means, the voltage of the one network reverses and adds to the voltage of the other network across the fourth terminals of both networks, the load being connected between said fourth terminals, the second and third terminals of the other network being connected at the other end thereof;

conductor means for connecting the fourth terminal of the one network to the negative terminal of said power supply and to one terminal of the load;

a charging diode connected across the load between the fourth terminals of the two networks for providing a charging path between the fourth terminal of the other network to the negative terminal of the power supply and for affording protection to the load against inverse voltage; and a clamper circuit connected across the load between the fourth terminals of the two networks for limiting pulse voltage across the fourth terminals and having rising ramp-like impedance during a pulse for approximating the inverse of the impedance of a variable impedance load to be connected between the fourth terminals.

3. The modulator circuit of claim 2 wherein the shorting switch means is a thyratron and further including a clipper means across the thyratron to protect the thyratron against inverse voltage.

4. The modulator circuit of claim 2 further comprising clipper means connected across the second and third terminals at the other end of the other network and including a diode and a resistor having resistance substantially equal to the impedance of the Blumlein circuit, whereby if there is a short circuit across the fourth terminals, the resistor of said clipper means functions as the matched load for the Blumlein circuit.

5. The modulator circuit of claim 2 wherein said clamper circuit includes a capacitor shunted by a bleeder resistor and in series with a diode and a resistor with resistance equal to the impedance of the Blumlein circuit, said diode being oriented for permitting the clamper capacitor to charge during a pulse applied across the fourth terminals of both networks.

6. The modulator circuit of claim 5 further comprising a second Blumlein circuit substantially identical to the first-recited Blumlein circuit and connected in parallel therewith to increase the current supplying capacity to a load and to limit current through the switch means.

7. In combination,
a cold cathode E-beam gun having an impedance that decreases to a predetermined low level upon application of a pulse of a predetermined rated voltage,
a transformerless Blumlein circuit connected to the terminals of the E-beam gun and having total impedance that is substantially equal to said predetermined low level for providing power pulses at approximately twice the rated voltage, and
a clamper circuit connected across the terminals of the E-beam gun for limiting the forward voltage applied across the E-beam gun to approximately rated voltage and that has an impedance substantially the inverse of the E-beam gun during a pulse.

8. The combination recited in claim 7 wherein said clamper circuit includes a series connected capacitor, first resistor and diode, a bleeder resistor connected in parallel with said capacitor, and wherein the first resistor has resistance substantially equal to the impedance of the Blumlein circuit.

9. The combination of claim 8 wherein said Blumlein circuit includes two networks and further comprising a diode connected across the E-beam gun to provide a charging path for one of the Blumlein networks and to provide a bypass for inverse voltage across the E-beam gun.

10. The combination recited in claim 9 further comprising a DC power supply of approximately the same voltage as the rated voltage, for charging the transformerless Blumlein circuit.

* * * * *